Sept. 11, 1956 B. H. ALEXANDER 2,762,730

METHOD OF MAKING BARRIERS IN SEMICONDUCTORS

Filed June 19, 1952

INVENTOR
BEN H. ALEXANDER
BY Paul S Martin
ATTORNEY 2,762,730

METHOD OF MAKING BARRIERS IN SEMICONDUCTORS

Ben H. Alexander, Waltham, Mass., assignor to Sylvania Electric Products Inc., a corporation of Massachusetts Application June 19, 1952, Serial No. 294,498

3 Claims. (Cl. 148—1.5)

The present invention relates to methods of making rectifying barriers in semiconductors, and of making electrical translators including area junction rectifiers, photoelectric devices, and electrical devices incorporating multiple area junctions. The methods described are applicable to a variety of materials, including silicon and germanium, but are described in connection with germanium to which these methods are especially applicable.

Rectifying barriers of the type here considered are found at a region where a portion of germanium of N-type conductivity meets a portion of germanium of P-type conductivity, the two portions being part of a single body of germanium. The type of conductivity is primarily controlled by the predominant content of "doping" or activating impurity. Notably limited amounts of metals of group III of the periodic chart, including particularly aluminum, gallium, and indium, are effective to impart P-type characteristics to the germanium. This content is computed in parts of impurity per million parts of germanium, or even less, where high resistivity germanium is required. Similarly, limited amounts of phosphorus, arsenic or antimony in group V of the periodic chart impart N-type conductivity, the resistivity being high where the content of impurity is low.

Electrical translating devices having P–N barriers have been formed by limited diffusion of an impurity into a slab of doped germanium of one conductivity type where the impurity produces the opposite conductivity type. Thus one may start with a slab of germanium containing a fractional percentage of indium. This P-type slab in the known diffusion method may be surface treated first by vapor deposition of an N-type impurity such as antimony followed by heat treatment below the melting temperature of the germanium slab to induce diffusion of the N-type impurity to a limited extent of penetration into the germanium. This procedure is effective for converting a layer of a P-type slab to N-type conductivity and therefore to produce a P–N barrier. However, the process is burdened with numerous difficulties, notably lack of control, limitations as to the amounts of impurities that may be used, and careful surface preparation. The deposited amount of impurity must be limited for fear of "balling up" and leaving bare parts of the germanium slab during heat-treatment for diffusion and thereby resulting in irregularities over the area of the slab. Also, where limited surface amounts of impurity are used, the surface concentration diminishes during the diffusion treatment, with poorer control over the extent of penetration of the impurity in relation to its rate-of-change in impurity concentration in the direction of penetration of the impurity into the slab.

An object of the present invention is to produce P–N barriers in semiconductors, and especially in germanium, by new methods that are effective to control the process both from the viewpoint of impurity concentration and uniformity across the area of the specimen.

A further object is to produce improved P–N barriers in a semiconductor, especially in germanium, by controlled diffusion of a selected impurity effective to reverse the conductivity type of a surface layer of the semiconductor.

An additional object is to provide P–N barriers in semiconductors, especially germanium, by controlled crystallization onto a body of one conductivity type of a surface layer of the opposite conductivity type.

The foregoing objects and others will be better understood from the detailed disclosure that follows, and additional features of novelty will become apparent. The methods used below for illustrative purposes depend upon the common principle that a body of relatively pure germanium or the like can be brought into contact with or immersed in a molten mixture of germanium and another material without hazard to the body of germanium where the molten mixture is saturated with germanium at a temperature below the melting point of germanium. This is insured by providing pieces of effectively pure germanium in the melt in equilibrium with the molten mixture at the operating temperature chosen, where the material added to the germanium depresses the melting point of germanium.

Thereafter a slab of germanium may be brought into flatwise contact (if one side only is to be treated) or it may be immersed in the melt, without danger of the slab dissolving in the melt. With its dimensions thus preserved, the slab can be used in controlled processes for forming P–N junctions as well as multiple related junctions. Where the melt contains an activating impurity, the germanium body can be exposed to a known constant surface concentration of impurity during a heat-diffusion treatment to convert a surface layer of a body of one conductivity type into the opposite conductivity type.

The melt can also be utilized as a source of germanium in adding to a germanium body of one conductivity type a surface layer of germanium of integral crystal structure but of the opposite conductivity type.

The conductivity type is controlled by the preponderance of donor and acceptor atoms present in minute amounts as compared to the germanium in the product, too small to depress the melting point of germanium noticeably. A much larger percentage of the impurity can be used in the melt, however, where the contrasting surface layer is to be produced by diffusion. By this procedure, substantial surface concentrations of the activating impurity can be maintained during the diffusion process.

Where the contrasting surface layer is to be produced by crystal growth, however, sufficiently large amounts of donor or acceptor materials to depress the melting point appreciably are generally impractical because of their effect of reducing the resistivity of the added germanium excessively for the electrical applications contemplated. When a contrasting layer is to be added by crystallization on the original specimen, germanium and tin of a high order of purity can be used together with an activating impurity in an amount appropriate to control the conductivity type of the crystals grown. Tin that is present is effective to depress the melting point of the mixture below that of the germanium body to be engaged with the melt without affecting the conductivity type of the crystal layer that is added to the original specimen. It is my conviction that reports of tin being effective to impart N-type conductivity is attributable to the amounts of impurity customarily found in commercially pure tin, or in the germanium itself as prepared for rectifiers heretofore. The tin-germanium melt should contain sufficient activating impurity to produce opposite conductivity from that of the slab brought into contact with the melt, this impurity to be added if it is not inherently present. During the process of crystallization, the germanium separates out from the tin. Most of the tin can be leached out chemically, and the residual tin can be ignored.

Of the materials in groups III and V of the periodic chart only one is not adaptable to use in the method where tin is not used, namely, boron, for the physical reason that, unlike the other donor and acceptor materials useful with germanium as a group IV semiconductor, boron seems to raise the melting temperature when alloyed with germanium above that of pure germanium. An activating trace of boron can, however, be used with tin, where the tin is relied on to depress the melting temperature of the mixture in a melt.

The three-phase system employing germanium, tin, and an activating impurity, is mentioned as being specially suited to the process in which a layer is added to an original slice of crystal by crystal growth. However this three-phase system is also applicable to the diffusion process, where a low but constant surface concentration of impurity is desired.

The invention in its various aspects will be better appreciated from a consideration of the detailed description that follows, where reference is made to the attached drawings wherein.

Figure 1:
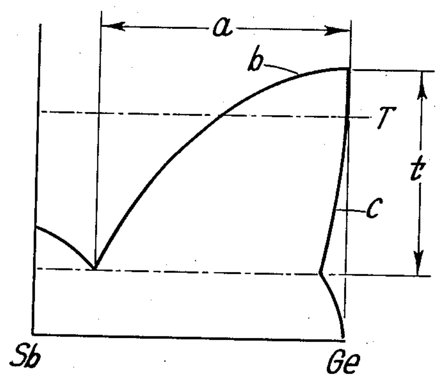
Figure 1 is a typical phase diagram of an impurity and germanium, in which antimony is illustrative.

Referring to Figure 1 there is shown a phase diagram of antimony and germanium where antimony is a typical and suitable impurity that can be used by diffusion to impart N-type conductivity to a layer of a slab that is wholly of P-type germanium at the outset. Throughout the range of concentrations indicated at *a* in the temperature range indicated by *t* there is a liquid plus solid mixture consisting of a germanium rich solid and an antimony rich germanium liquid. At the extremes of the diagram there are represented, respectively, 100% antimony and 100% germanium, each diminishing to zero at the opposite extreme. The curve *b* or the "liquidus" shows the composition of the molten material at a coordinate temperature in the range *t*, where the molten material is in contact with germanium in solid state. If the temperature should rise from a given point, the percentage of germanium in the molten material increases as indicated by curve *b*, and this rise in germanium content in the molten mixture is obtained from the solid-state germanium that goes into solution. A decrease in temperature is accompanied by a separation out of the liquid of germanium rich solid of compositions indicated by curve *c*.

The solid plus liquid mixture is obtained by adding pure germanium (desirably approaching theoretically pure germanium, that is, of 60 ohm-centimeters in resistivity) to similarly pure antimony liquid until the molten mixture is saturated, and then by adding a small additional quantity of solid germanium to insure that the antimony-germanium liquid will remain saturated with germanium. This forestalls any tendency of the slab of germanium that is to be introduced into this liquid (Fig. 2) to be corroded or dissolved by the molten mixture. The foregoing contemplates any suitable predetermined operating temperature at which the liquid has a desired percentage of germanium and antimony for achieving the desired diffusion characteristics and the desired electrical performance in the product.

Figure 2:
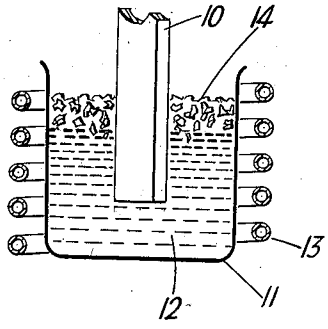
Figure 2 is a diagram illustrating application of the methods.

The physical arrangement is illustrated in Figure 2 where a specimen 10 of germanium, conveniently a slab of P-type germanium, including for example a trace of indium as a P-type activating impurity, would be immersed in liquid 12 consisting of antimony (an N-type impurity) and germanium in proportions determined by the operating temperature T in Figure 1. In equilibrium with this molten mixture 12 is a quantity 14 of pure or antimony-doped germanium so that the mixture remains saturated with germanium. After the slab 10 has been introduced into the germanium-antimony liquid, diffusion commences without any fear of germanium from specimen 10 dissolving into this mixture. Diffusion of antimony into the germanium slab proceeds, during the time of immersion, in varied concentrations and to an extent (measured from the surface of the specimen) that are controlled by the temperature of the melt which in turn determines the respective concentrations of antimony in the liquid 12, and in the surface of the slab. During this operation, the temperature is desirably held constant.

The foregoing is carried out using known apparatus and techniques, conveniently in an inert atmosphere or vacuum furnace, with a resistance or radio-frequency heating element 13, and using a suitable crucible 11, advantageously of purest available graphite.

By changing the temperature (and correspondingly changing the concentration) and further by changing the time of treatment, the N-type layer of antimony doped germanium on the P-type germanium specimen can be controlled for changing the resulting electrical properties.

Figure 5:
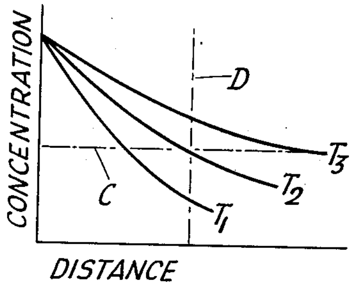
Figure 5 is a diagram showing the effect of the diffusion process used in producing the device of Figure 3.

Three curves appear in Figure 5 showing the concentration of the diffused impurity as it decreases within the germanium at distances measured away from the surface. All three use the same surface concentration of impurity, which concentration is maintained during the heat-treatment.

This process produces a body 10 of germanium that initially was sliced from a single crystal, of P-type throughout, but is converted to N-type conductivity where it was exposed to the melt as illustrated in Figure 2. The diffusion treatment is continued for a time to produce an N-type impurity concentration at a distance D from the surface exceeding the initial P-type impurity concentration C (Fig. 5). This unit is completed into a junction triode, or junction transistor, by adding ohmic terminals 16, 18 and 20, and by cutting away the sides and the ends, as indicated by the broken horizontal lines in Figure 3. In order to produce a junction rectifier, the unit in Fig. 3 may be used without removing the end portions; or one face only of the slab may be brought into surface contact with the melt in Figure 2. Both the diode and the triode exhibit photoelectric effects.

The material chosen above for mixing with germanium and the phase diagram resulting are typical as well for other materials of group V of the periodic chart. Arsenic may be preferred in some respects to antimony. Nitrogen and phosphorus, though gases, behave qualitatively like arsenic and antimony, possibly because of compounds they form with the germanium itself. Likewise, elements in group III (except boron) can be used for doping by diffusion in the above method, starting with a slab of N-type germanium. Boron in small amounts can be used, provided that virtually pure tin is used as the element relied on to depress the melting temperature of germanium so as to prevent the germanium slab to be processed from going into solution. Pure tin can similarly be used with donor and acceptor materials in the foregoing process. While groups III and V materials have been mentioned as operative to dope germanium and have been preferred, in theory any material in the periodic chart (except the rare gases that theoretically are not operative) can be used in this method; and with the same doping materials, silicon may be substituted in the method.

Figure 3:
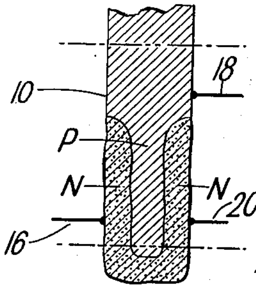
Figures 3 and 4 are greatly enlarged cross-sectional views illustrating completion of two multiple-junction devices made with the principles here disclosed.

The structure in Fig. 3 is operated by applying positive and negative bias, respectively on terminals 16 and 20 in relation to terminal 18 (see "Electrons and Holes in Semiconductors" by Shockley, 1950, Van Nostrand) with an appropriate signal source and a load.

Figure 4:
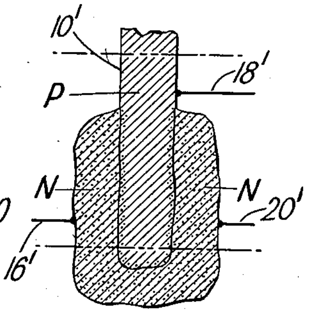

If the temperature of the melt is allowed to drop during the treatment, the material remaining molten will follow the "liquidus" *b* in Fig. 1, germanium thereupon separating out as a solid, heavily doped with antimony. The antimony content in the solid is but a small percentage, as indicated by the intersection of curve *c* with any given operating temperature T. The material thus becoming solid forms crystals, and tends to grow integrally as a single crystal on the single-crystal slab 10. There is also some limited penetration of the impurity into the slab during the crystal growth. This is another way of providing a surface layer of germanium of a conductivity type opposite that of slab 10. The product is illustrated in Fig. 4, with primed numbers corresponding to Fig. 3 and with the material of surface conductivity type represented by the dotted region; and either a junction triode or an area or junction rectifier is produced depending on whether material is cut away along the broken lines, or not.

The concentration of antimony (or other doping material) in the solid germanium that crystallizes out of a two-phase melt and grows on the slab 10 upon a slow drop in temperature, is of a resistivity too low for some electrical applications. The amount of impurity in the grown portion of the crystal can, however, be held to lower proportions by relying on tin (as above mentioned) rather than the doping material to depress the melting point of the mixture and thereby protect the treated slab from attack by the melt; and when the tin is used, any desired low concentration of the doping material can be used.

The foregoing methods of preparing semiconductor translators are naturally susceptible to variation in matters of detail and application by those skilled in the art; and accordingly the appended claims should be allowed that broad interpretation that is commensurate with the spirit and scope of the invention.

I claim:

1. The method of producing an electrical translator including the steps of providing a solid body of germanium of one conductivity type, bringing said solid germanium body into engagement with a molten mixture containing an activating impurity of the opposite conductivity type at the melting temperature of the mixture, said molten mixture having a temperature below the melting point of said germanium body and being saturated with germanium, and maintaining said engagement for a time sufficient to convert by diffusion of said activating impurity into said body a surface of said body to the opposite conductivity type.

2. The method of producing an electrical translator including the steps of providing a solid germanium body of one conductivity type, and bringing said solid germanium body into engagement with a molten mixture at the melting temperature thereof and containing an activating impurity effective to reduce the melting temperature of germanium when alloyed therewith, said impurity being effective to impart the opposite conductivity type to germanium, said molten mixture being maintained in equilibrium with solid germanium also present in contact with the molten mixture at the time of said engagement of the germanium body with the molten mixture, and maintaining said engagement for a time commensurate with the desired degree of diffusion of the impurity into the body related to the impurity concentration and temperature of the molten mixture.

3. The method of producing in a germanium body of one conductivity type a surface layer of opposite conductivity type, including the steps of providing a germanium body containing an impurity effective to impart one conductivity type, bringing the body into engagement with a molten mixture effective to impart opposite conductivity type to germanium, said mixture being at the melting point thereof and saturated with germanium, said mixture also containing tin to reduce the melting temperature below that of the melting point of said body and additionally containing an activating impurity, and maintaining the engagement of said body with said melt for a time sufficient to produce diffusion of said activating impurity into the body to convert a surface layer of the body to opposite conductivity type.

References Cited in the file of this patent

UNITED STATES PATENTS

| | | |
|---|---|---|
| 1,654,910 | Barbier | Jan. 3, 1928 |
| 2,603,692 | Scaff et al. | July 15, 1952 |
| 2,629,672 | Sparks | Feb. 24, 1953 |
| 2,701,216 | Seiler | Feb. 1, 1955 |
| 2,708,646 | North | May 17, 1955 |